(12) United States Patent
Barabash et al.

(10) Patent No.: US 9,177,916 B1
(45) Date of Patent: Nov. 3, 2015

(54) AMORPHOUS SILICON DOPED WITH FLUORINE FOR SELECTORS OF RESISTIVE RANDOM ACCESS MEMORY CELLS

(71) Applicant: Intermolecular, Inc., San Jose, CA (US)

(72) Inventors: Sergey Barabash, San Jose, CA (US); Dipankar Pramanik, Saratoga, CA (US)

(73) Assignee: Intermolecular, Inc., San Jose, CA (US)

( * ) Notice: Subject to any disclaimer, the term of this patent is extended or adjusted under 35 U.S.C. 154(b) by 0 days.

(21) Appl. No.: 14/553,354

(22) Filed: Nov. 25, 2014

(51) Int. Cl.
*H01L 23/52* (2006.01)
*H01L 23/528* (2006.01)

(52) U.S. Cl.
CPC ..................... *H01L 23/528* (2013.01)

(58) Field of Classification Search
CPC ....................................... H01L 23/528
USPC ........................................ 257/211
See application file for complete search history.

(56) References Cited

U.S. PATENT DOCUMENTS

| 5,565,695 | A | 10/1996 | Johnson |
| 8,027,209 | B2 | 9/2011 | Yan et al. |
| 8,238,174 | B2 | 8/2012 | Yan et al. |
| 2005/0269606 | A1* | 12/2005 | Mouli ........................ 257/292 |
| 2015/0132938 | A1* | 5/2015 | Ahmed et al. ............. 438/591 |

* cited by examiner

*Primary Examiner* — Anthony Ho

(57) ABSTRACT

Provided are resistive switching memory cells having selectors and methods of fabricating such cells. A selector may be disposed between an electrode and resistive switching layer. The selector is configured to undergo an electrical breakdown when a voltage applied to the selector exceeds a selected threshold. The selector is formed from amorphous silicon doped with fluorine. The concentration of fluorine may be between about 0.01% atomic and 3% atomic, such as about 1% atomic. Amorphous silicon has a larger band gap than, for example, crystalline silicon and, therefore, has a lower leakage. Dangling bond and weak bond states appearing in the mid-gap position of amorphous silicon are eliminated by adding fluorine. Fluorine binds to and passivates defects. In some embodiments, a fluorine reservoir is positioned in a low current density region of the memory cell to counter diffusion of fluorine from the selector into other components.

10 Claims, 7 Drawing Sheets

Initial Forming

Operational Switching

AMORPHOUS SILICON DOPED WITH FLUORINE FOR SELECTORS OF RESISTIVE RANDOM ACCESS MEMORY CELLS

BACKGROUND

Nonvolatile memory is computer memory capable of retaining stored information even when unpowered. Nonvolatile memory is typically used for secondary storage or long-term persistent storage and may be used in addition to volatile memory, which loses the stored information when unpowered. Nonvolatile memory can be permanently integrated into computer systems (e.g., solid state hard drives) or can take the form of removable and easily transportable memory cards (e.g., USB flash drives). Nonvolatile memory is becoming more popular because of its small size/high density, low power consumption, fast read and write rates, retention, and other characteristics.

Flash memory is a common type of nonvolatile memory because of its high density and low fabrication costs. Flash memory is a transistor-based memory device that uses multiple gates per transistor and quantum tunneling for storing the information on its memory device. Flash memory uses a block-access architecture that can result in long access, erase, and write times. Flash memory also suffers from low endurance, high power consumption, and scaling limitations.

The constantly increasing speed of electronic devices and storage demand drive new requirements for nonvolatile memory. For example, nonvolatile memory is expected to replace hard drives in many new computer systems. However, transistor-based flash memory is often inadequate to meet the requirements for nonvolatile memory. New types of memory, such as resistive random access memory, are being developed to meet these demands and requirements.

SUMMARY

Provided are resistive switching memory cells having selectors and methods of fabricating such cells. A selector may be disposed between an electrode and resistive switching layer. The selector is configured to undergo an electrical breakdown when a voltage applied to the selector exceeds a selected threshold. For purposes of this disclosure, the breakdown is defined as a reversible process associated with a rapid change in resistance of the selector. Various aspects of this process are further described below in particular with reference to FIGS. 3C-3E. The selector is formed from amorphous silicon doped with fluorine. The concentration of fluorine may be between about 0.01% atomic and 3% atomic, such as about 1% atomic. Amorphous silicon has a larger band gap than, for example, crystalline silicon and, therefore, has a lower leakage. Dangling bond and weak bond states appearing in the mid-gap position of amorphous silicon are eliminated by adding fluorine. Fluorine binds to and passivates defects. In some embodiments, a fluorine reservoir is positioned in a low current density region of the memory cell to counter diffusion of fluorine from the selector into other components.

In some embodiments, a resistive switching memory cell includes a first layer disposed over a substrate, a second layer disposed over the first layer such that the first layer is disposed between the second layer and the substrate, a third layer disposed over the second layer such that the second layer is disposed between the first layer and the third layer, and a fourth layer disposed over the third layer such that the third layer is disposed between the second layer and the fourth layer. The first layer and the fourth layer are operable as electrodes and may be referred to as a first electrode and second electrode, respectively. The second layer is operable to switch between a low resistive state and a high resistive state in response to a switching pulse applied between the first layer and the fourth layer. The second layer may be referred to as a resistive switching layer. The third layer is operable as a selector and includes amorphous silicon doped with fluorine. The selector is configured to undergo electrical breakdown when a voltage across the selector achieves a certain threshold. In some embodiments, the third layer is configured to remain at least partially amorphous when subjected to anneal at a temperature of 750 degrees Celsius.

In some embodiments, the concentration of fluorine in the third layer is between about 0.01% atomic and 3% atomic or, more specifically, between about 0.5% atomic and 2% atomic. The third layer may consist essentially of amorphous silicon and fluorine. In other words, the third layer may have substantially no components other than amorphous silicon and fluorine. Specifically, the combined concentration of amorphous silicon and fluorine in the third layer may be at least about 99.5% atomic and even at least about 99.9% atomic.

In some embodiments, the third layer directly interfaces the fourth layer, and at least a portion of the fourth layer interfacing the third layer is doped with fluorine. The concentration of fluorine in that portion of the fourth layer may be greater than the concentration of fluorine in the third layer. As such, the fourth layer may be operable as a fluorine reservoir for the third layer. Overtime, fluorine may be depleted from the third layer due to fluorine diffusion out of the third layer resulting from the concentration gradients, electrical potentials applied to the third layer, and other factors.

In some embodiments, the resistive switching memory cell includes a fluoride ion source directly interfacing the third layer. In this case, the fluoride ion source may be separate from any one of the four layers listed and described above. The concentration of fluorine in the fluoride ion source may be higher than the concentration of fluorine in the third layer. In this case, the third layer may also directly interface the fourth layer, which may be responsible for depleting fluorine from the third layer.

In some embodiments, the second layer includes one of hafnium oxide, zirconium oxide, tantalum oxide, titanium oxide, aluminum oxide, or silicon oxide. More specifically, the second layer may include a first sub-layer including silicon oxide and a second sub-layer including hafnium oxide. The third layer directly may directly interface the second layer.

Provided also is a method of forming a resistive switching memory cell. The method may involve forming a first layer over a substrate, forming a second layer over the first layer, forming a third layer over the second layer, and forming a fourth layer over the third layer. The first layer and the fourth layer are operable as electrodes. The second layer is operable to switch between a low resistive state and a high resistive state in response to a switching pulse applied to the first layer and the fourth layer. The third layer is operable as a selector and comprises amorphous silicon doped with fluorine. Various features of these four layers are described above.

In some embodiments, forming the fourth layer involves forming an amorphous silicon layer and implanting fluorine into the amorphous silicon layer using ion implantation. For example, ion implantation may be used for this purposes followed by annealing the amorphous silicon layer with implanted fluorine. The amorphous silicon layer may be formed using chemical vapor deposition. In some embodiments, the second layer is formed using atomic layer deposition. In some embodiments, the method also involves annealing the resistive switching memory cell at a temperature of about 750 degrees Celsius or up to about 100 degrees Celcius. The third layer remains amorphous after this annealing operation.

These and other embodiments are described further below with reference to the figures.

BRIEF DESCRIPTION OF THE DRAWINGS

To facilitate understanding, the same reference numerals have been used, where possible, to designate common components presented in the figures. The drawings are not to scale and the relative dimensions of various elements in the drawings are depicted schematically and not necessarily to scale. Various embodiments can readily be understood by considering the following detailed description in conjunction with the accompanying drawings.

DETAILED DESCRIPTION

A detailed description of various embodiments is provided below along with accompanying figures. The detailed description is provided in connection with such embodiments, but is not limited to any particular example. The scope is limited only by the claims and numerous alternatives, modifications, and equivalents are encompassed. Numerous specific details are set forth in the following description in order to provide a thorough understanding. These details are provided for the purpose of example and the described techniques may be practiced according to the claims without some or all of these specific details. For the purpose of clarity, technical material that is known in the technical fields related to the embodiments has not been described in detail to avoid unnecessarily obscuring the description.

INTRODUCTION

A ReRAM cell exhibiting resistive switching characteristics generally includes multiple layers formed into a stack, such as a "metal-insulator-metal" (MIM) stack. The stack includes two conductive layers operating as electrodes, which are identified as "M" and may include a metal, but may also include other types of conductive materials, such as doped silicon. These conductive layers may be referred to as electrodes. The stack also includes an insulator layer provided in between the two electrodes and identified as "I". The insulator layer changes its resistive properties when certain a set voltage or a rest voltage is applied to the layer in a form of one or more pulses. Due to its variable resistance characteristics, the insulator layer may be also referred to as a variable resistance layer. These changes in resistive properties are used to store data. For example, when two different resistive states are identified (e.g., a high resistive state and a low resistive state) for a ReRAM cell, one state may be associated with a logic "zero", while the other state may be associated with a logic "one" value. Similar approaches may be used when three or more resistive states may be identified for the same ReRAM cell leading to various multibit architectures. The resistive properties (and the current data) may be monitored by applying a reading voltage, which does not change the resistive state of the insulator layer and generally has a much lower magnitude that set and reset voltages. The switching operation may involve one or more voltage pulses or, more specifically, one or more set voltage pulses or one or more reset voltage pulses. Each pulse may have a certain predetermined duration.

Figure 5A:
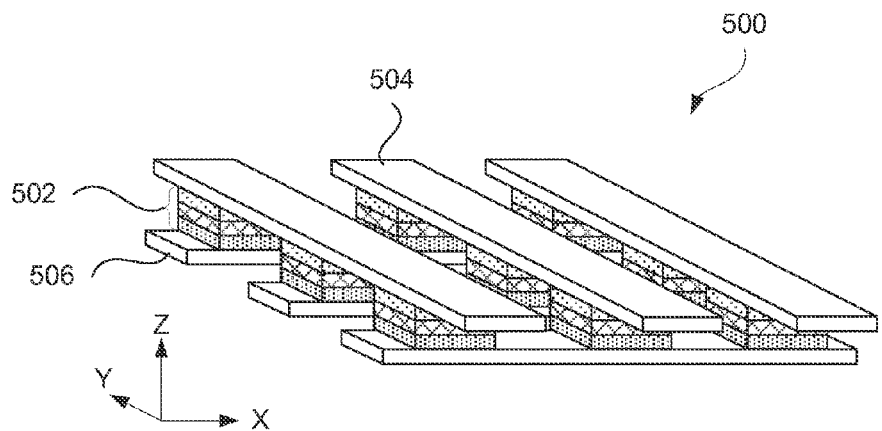
FIGS. 5A and 5B illustrate schematic views of memory arrays including multiple ReRAM cells, in accordance with some embodiments.

When multiple ReRAM cells are arranged into an array as further described below with reference to FIGS. 5A and 5B, each cell needs to be addressed individually without impacting other cells. For example, a switching signal may need to be applied to one cell using shared signal lines without switching or otherwise impacting other cells. Because the cells in the same array share signal lines various cross-talks are possible and generally need to be prevented. Conventional ReRAM cells use diodes or transistors to eliminate these issues. Specifically, each cell may be connected in series with a diode or transistor, which controls the current flow through the cell. However, diodes and transistors are complex and often bulky components that require many processing steps and make it difficult to form high density memory arrays. Some processing operations, such as diode activation at a high temperature (e.g., about 750° C.) may negatively impact other components of ReRAM cells further complicating cell design and fabrication.

It has been found that certain materials can be formed into a single layer that can be operable as a ReRAM cell selector or simply a selector. For purposes of this disclosure, a selector is defined as a single layer component that undergoes an electrical breakdown when a high voltage is applied to the layer. The electrical breakdown may be represented by FIGS. 3C and 3D or have a more complex hysteretic behavior because the current-voltage curve may be multivalued. In the latter case, different upward branches are followed during voltage changes. Upon reaching the threshold voltage, the current increases in a step-like manner to a new value, which may be set by the current compliance/series resistance. The current will not decrease substantially until the current and, as a result the voltage is lowered below holding voltage. As such, at the high voltage, the selector allows high currents to pass through it and, for example, through a resistive switching layer of a ReRAM cell when the selector is connected in series with this layer or, more specifically, when both selector and resistive switching layer are stacked between two electrodes of the ReRAM cell. However, if the breakdown conditions are not met (e.g., a low voltage is applied the selector), the selector has a high resistance and allows only small currents to pass through it and, for example, through the resistive switching layer. The performance of a selector suitable for integration into a ReRAM cell is further described below with reference to FIGS. 3C and 3D. For some ReRAM applications, a selector can operate in a bipolar mode (i.e., have a symmetric I-V curve). The breakdown voltage for ReRAM applications may depend on the design and the materials of a ReRAM cell. In some examples, the breakdown voltage may be between about 1 and 5 volts. It should be noted that for the same materials, the breakdown voltages depends on the thickness of the selector.

In some embodiments, the selector is a layer of amorphous silicon (a-Si) doped with fluorine (F). The dopant concentration may be between about 0.01% atomic and 3% atomic or, more specifically, between about 0.5% atomic and 2% atomic, such as about 1% atomic. A selector may be formed by depositing amorphous silicon using, for example, chemical vapor deposition (CVD). Fluorine can be introduced during deposition of amorphous silicon or after its deposition. For example, fluorine can be implanted into amorphous silicon after its deposition.

The current allowed to pass through the selector after the selector goes through an electrical breakdown may be referred to as an on-state current to distinguish it from an off-state current, which is a current allowed to pass through the selector before the selector goes through the electrical breakdown. Without being restricted to any particular theory, it is believed that the high on-state current and symmetric I-V curve can be obtained using band-to-band tunneling in certain semiconductor materials that have band gaps lower than the breakdown voltage. Without being restricted to any particular theory, it is further believed that the band gap of such semiconductor may be comparable to the breakdown voltage, because the typical dimensions (e.g., the thickness) of ReRAM device components can be comparable to the carrier mean free path. While the direct gap in crystalline silicon satisfies this criterion, crystalline silicon has high leakage in the off-state and high coupling to phonons. These phenomena are believed to exist because of the phonon-assisted indirect tunneling via the smaller indirect gap. Furthermore, crystalline silicon is generally harder to integrate into ReRAM cells. Another material in this category is polysilicon. However, polysilicon has undesirable grain boundary leakage.

Amorphous silicon is believed to be a suitable material for selector applications in ReRAM cells. Unlike crystalline silicon, amorphous silicon has a larger gap that is not susceptible to phonon-assisted indirect tunneling due to the lack of a band structure in amorphous materials. However, pure amorphous silicon still has a high leakage in the off-state due to localized dangling bond states and weak bond states that appear inside the energy gap of amorphous silicon. The existence of these localized states inside the energy gap is confirmed by first-principles simulations within the density-functional theory, in which models of amorphous silicon are generated using ab initio molecular dynamics, and the resulting full and partial densities of electron states are analyzed to identify the localized states inside the energy gap. These localized states lead to substantial leakage in part because of trap assisted tunneling.

The first principles simulations further demonstrate that these defects (i.e., dangling bond states and weak bond states that cause leakage) can be effectively passivated with fluorine. Passivation of these defects is believed to eliminate the electronic states in the mid-gap. Specifically, sufficient passivation is achieved when most defects are bound to fluorine atoms. For example, a dangling bond defects can be passivated by a fluorine atom, if the fluorine atom forms a covalent bond with the silicon atom that used to have a dangling bond. As another example, a weak bond defect can be passivated by two fluorine atoms, if the weak bond between two silicon atoms is entirely broken and each of the two silicon atoms instead forms a covalent bond with one of the two fluorine atoms. Without being restricted to any particular theory, it is believed that fluorine can be effective in passivating defects in material for selector applications because it only forms a single covalent bond, has a relatively small atomic size, forms a strong bond with the passivated site and exhibits high barriers for diffusion. For example, nitrogen may not be as effective as fluorine in passivating defects because each nitrogen atom needs to form three covalent bonds while the defect geometry may allow for one or at most two states. Chlorine may also be not as effective as fluoride because its large atomic creates large elastic strain fields thereby decreasing chlorine incorporation. Yet another example, hydrogen may be less effective than chlorine or fluorine because hydrogen exhibits low barriers for breaking the bond with the passivated atom and for diffusion that can lead to device degradation.

The number of coordination defects in amorphous silicon depends on preparation of a selector, in in particular on annealing conditions that the selector can experience when a ReRAM cell including this selector is fabricated. Insufficient amount of fluorine atoms will result in incomplete passivation and the selector will retain its leakage. On the other hand, introducing too much fluorine into amorphous silicon may create interstitial states. The simulations show that the fully-passivated configuration can also be most energetically favorable. Thus, an equilibrium state with minimal annealing may be achieved if the number of fluorine atoms is sufficient and comparable to the number of the structural defects responsible for mid-gap states. In general, the larger is the concentration of defects in amorphous silicon, the larger fluorine concentration can be required. For example, materials deposited at lower temperatures can require larger fluorine content. Post-deposition annealing can reduce the number of defects and thus decrease the required amount of fluorine, however, high annealing temperatures (e.g. such as above 750° C.) can cause a transformation of amorphous silicon into a crystalline form.

Without being restricted to any particular theory, it is believed that high electrical fields developed across the doped selector during its operation may cause degradation. In particular, degradation may be due to diffusion of fluoride ions formed in the selector during its fabrication. These fluoride ions are charged species that under certain electrical fields can break their bonds and can be carried by the fields into a new location in the selector, or even away from the selector. As such, the selector may be depleted with from fluoride ions and may start exhibiting leakage as described above.

To reduce the diffusion of the fluoride ions from the selector, a ReRAM cell may include a supply of fluoride ions in another component, which is positioned adjacent to the selector. For example, a selector may be disposed between and directly interface a resistive switching layer and electrode. During operation, most of the fluoride ions may be moving into the resistive switching layer, for example. This unidirectional fluoride ion loss may be more prevalent in unipolar ReRAM cells, which are further described below with reference to FIG. 2A. In this example, the electrode may have fluoride ions. In some embodiments, the concentration of fluoride ions in the electrode is higher than such concentration in the selector. However, the fluoride ion source should not cause excessive concentration of fluoride ions in the selector after the ReRAM cell is fabricated and started operating. In some embodiments, a fluoride ion source may be positioned in such a way the fields and currents through the fluoride ion source are less than through the selector. Such location of the fluoride ion source helps to slow the diffusion driven degradation of the fluoride ion source and permits the use of the fluoride ion source with higher concentrations of fluoride ions in comparison to the selector.

In some embodiments, a fluoride ion source may also include amorphous silicon. Unlike the selector, the fluoride ion source may be oversaturated. The oversaturation can be achieved by ion implantation at relatively high ion energies. In general, fluorine concentration should be maintained below the level that would allow development of silicon fluorine ($SiF_4$) bubbles inside the source.

Examples of Nonvolatile ReRAM Cells and their Switching Mechanisms

A brief description of ReRAM cells is provided for context and better understanding of various aspects described above. As stated above, a ReRAM cell includes a dielectric material formed into a layer exhibiting resistive switching characteristics. A dielectric, which is normally insulating, can be made to conduct through one or more conductive paths formed after application of a voltage. The conductive path formation can arise from different mechanisms, including defects, metal migration, and other mechanisms further described below. Once one or more conductive paths (e.g., filaments) are formed in the dielectric component of a memory device, these conductive paths may be reset (or broken resulting in a high resistance) or set (or re-formed resulting in a lower resistance) by applying certain voltages. Without being restricted to any particular theory, it is believed that resistive switching corresponds to migration of defects within the resistive switching layer and, in some embodiments, across one interface formed by the resistive switching voltage, when a switching voltage is applied to the layer.

Figure 1A:
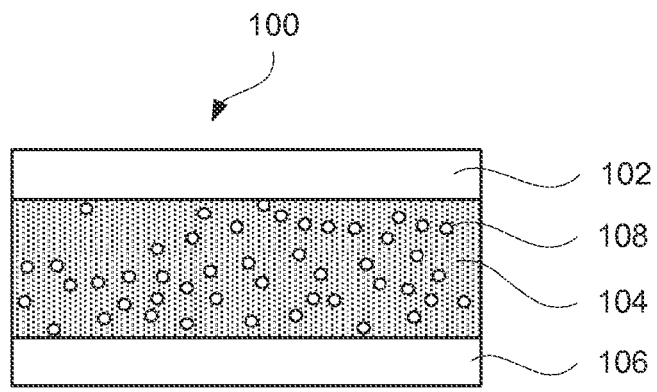
FIGS. 1A-1C illustrate schematic representations of the ReRAM cell in its low resistive state (LRS) and high resistive state (HRS), in accordance with some embodiments.

FIG. 1A illustrates a schematic representation of ReRAM cell 100 including first electrode 102, second electrode 106, and resistive switching layer 104 disposed in between first electrode 102 and second electrode 106. It should be noted that the "first" and "second" references for electrodes 102 and 106 are used solely for differentiation and not to imply any processing order or particular spatial orientation of these electrodes. ReRAM cell 100 may also include other components, such as diode, diffusion barrier layer, and other components. ReRAM cell 100 is sometimes referred to as a memory element or a memory unit.

First electrode 102 and second electrode 106 may be used as conductive lines within a memory array or other types of devices that ReRAM cell is integrated into. As such, electrode 102 and 106 are generally formed from conductive materials. As stated above, one of the electrodes may be reactive electrode and act as a source and as a reservoir of defects for the resistive switching layer. That is, defects may travel through an interface formed by this electrode with the resistive switching layer (i.e., the reactive interface).

Resistive switching layer 104 which may be initially formed from a dielectric material and later can be made to conduct through one or more conductive paths formed within the layer by applying first a forming voltage and then a switching voltage. To provide this resistive switching functionality, resistive switching layer 104 includes a concentration of electrically active defects 108, which may be at least partially provided into the layer during its fabrication. For example, some atoms may be absent from their native structures (i.e., creating vacancies) and/or additional atoms may be inserted into the native structures (i.e., creating interstitial defects). Charge carriers may be also introduced as dopants, stressing lattices, and other techniques. Regardless of the types all charge carriers are referred to as defects 108.

FIG. 1A is a schematic representation of ReRAM cell 100 prior to initial formation of conductive paths, in accordance with some embodiments. Resistive switching layer 104 may include some defects 108. Additional defects 108 may be provided within first electrode 102 and may be later transferred to resistive switching layer 104 during the formation operation. In some embodiments, the resistive switching layer 104 has substantially no defects prior to forming operation and all defects are provided from first electrode 102 during forming. Second electrode 106 may or may not have any defects. It should be noted that regardless of presence or absence of defects in second electrode 106, substantially no defects are exchanged between second electrode 106 and resistive switching layer 104 during forming and/or switching operations.

Figure 1B:
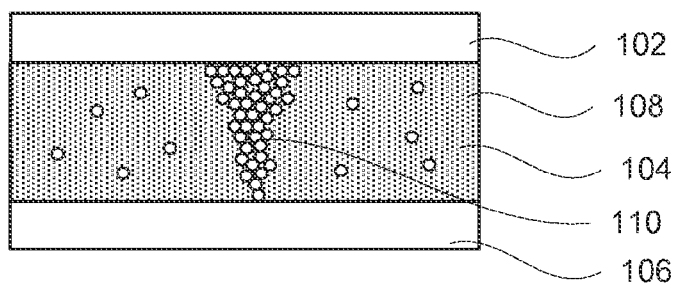

During the forming operation, ReRAM cell 100 changes its structure from the one shown in FIG. 1A to the one shown in FIG. 1B. This change corresponds to defects 108 being arranged into one or more continuous paths within resistive switching layer 104 as, for example, schematically illustrated in FIG. 1B. Without being restricted to any particular theory, it is believed that defects 108 can be reoriented within resistive switching layer 104 to form these conductive paths as, for example, schematically shown in FIG. 1B. Furthermore, some or all defects 108 forming the conductive paths may enter resistive switching layer 104 from first electrode 102. For simplicity, all these phenomena are collectively referred to as reorientation of defects within ReRAM cell 100. This reorientation of defects 108 occurs when a certain forming voltage is applied to electrodes 102 and 106. In some embodiments, the forming operation also conducted at elevated temperatures to enhanced mobility of the defects within ReRAM cell 100. In general, the forming operation is considered to be a part of the fabrication of ReRAM cell 100, while subsequent resistive switching is considered to be a part of operation of ReRAM cell.

Figure 1C:
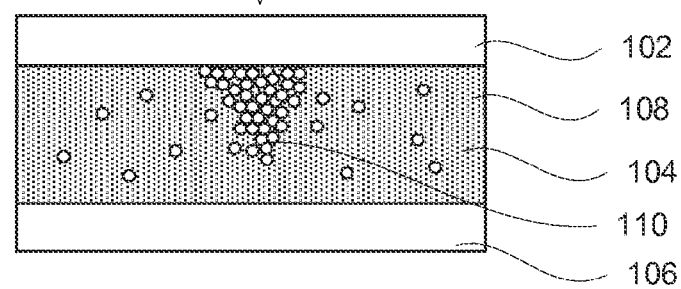

Resistive switching involves breaking and reforming conductive paths through resistive switching layer 104, i.e., switching between the state schematically illustrated in FIG. 1B and the state schematically illustrated in FIG. 1C. The resistive switching is performed by applying switching voltages to electrodes 102 and 106. Depending on magnitude and polarity of these voltages, conductive path 110 may be broken or formed back again. These voltages may be substantially lower than forming voltages (i.e., voltages used in the forming operation) since much less mobility of defects is needed during switching operations. For example, hafnium oxide based resistive layers may need about 7 Volts during their forming but can be switched using voltages less than 4 Volts.

The state of resistive switching layer 104 illustrated in FIG. 1B is referred to as a low resistance state (LRS), while the state illustrated in FIG. 1C is referred to as a high resistance state (HRS). The resistance difference between the LRS and HRS is due to different number and/or conductivity of conductive paths that exists in these states, i.e., resistive switching layer 104 has more conductive paths and/or less resistive conductive paths when it is in the LRS than when it is in the HRS. It should be noted that resistive switching layer 104 may still have some conductive paths while it is in the HRS, but these conductive paths are fewer and/or more resistive than the ones corresponding to the LRS.

When switching from its LRS to HRS, which is often referred to as a reset operation, resistive switching layer 104 may release some defects into first electrode 102. Furthermore, there may be some mobility of defects within resistive switching layer 104. This may lead to thinning and, in some embodiments, breakages of conductive paths as shown in FIG. 1C. Depending on mobility within resistive switching layer 104 and diffusion through the interface formed by resistive switching layer 104 and first electrode 102, the conductive paths may break closer to the interface with second electrode 106, somewhere within resistive switching layer 104, or at the interface with first electrode 102. This breakage generally does not correspond to complete dispersion of defects forming these conductive paths and may be a self-limiting process, i.e., the process may stop after some initial breakage occurs.

When switching from its HRS to LRS, which is often referred to as a set operation, resistive switching layer 104 may receive some defects from first electrode 102. Similar to the reset operation described above, there may be some mobility of defects within resistive switching layer 104. This may lead to thickening and, in some embodiments, reforming of conductive paths as shown in FIG. 1B. In some embodiments, a voltage applied to electrodes 102 and 106 during the set operation has the same polarity as a voltage applied during the reset operation. This type of switching is referred to as unipolar switching. Alternatively, a voltage applied to electrodes 102 and 106 during the set operation may have different polarity as a voltage applied during the reset operation. This type of switching is referred to as bipolar switching. Setting and resetting operations may be repeated multiple times as will now be described with reference to FIGS. 2A and 2B.

Figure 2A:
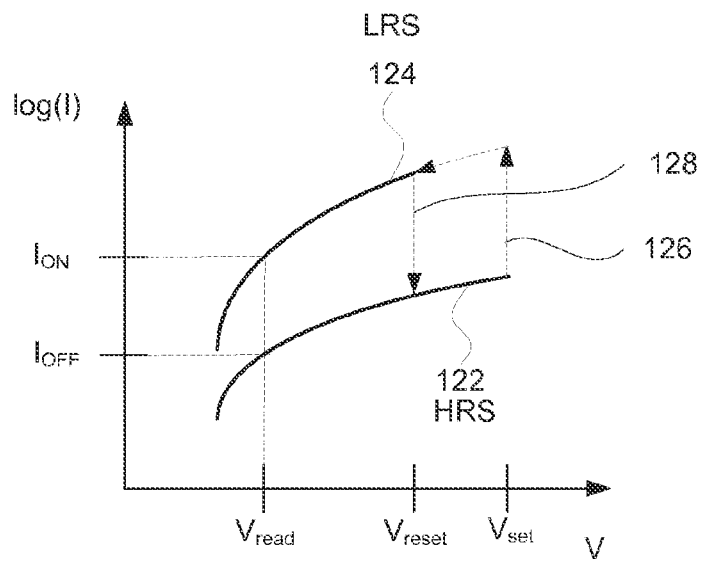
FIG. 2A illustrates a plot of a current passing through a unipolar ReRAM cell as a function of a voltage applied to the ReRAM cell, in accordance with some embodiments.
Figure 2B:
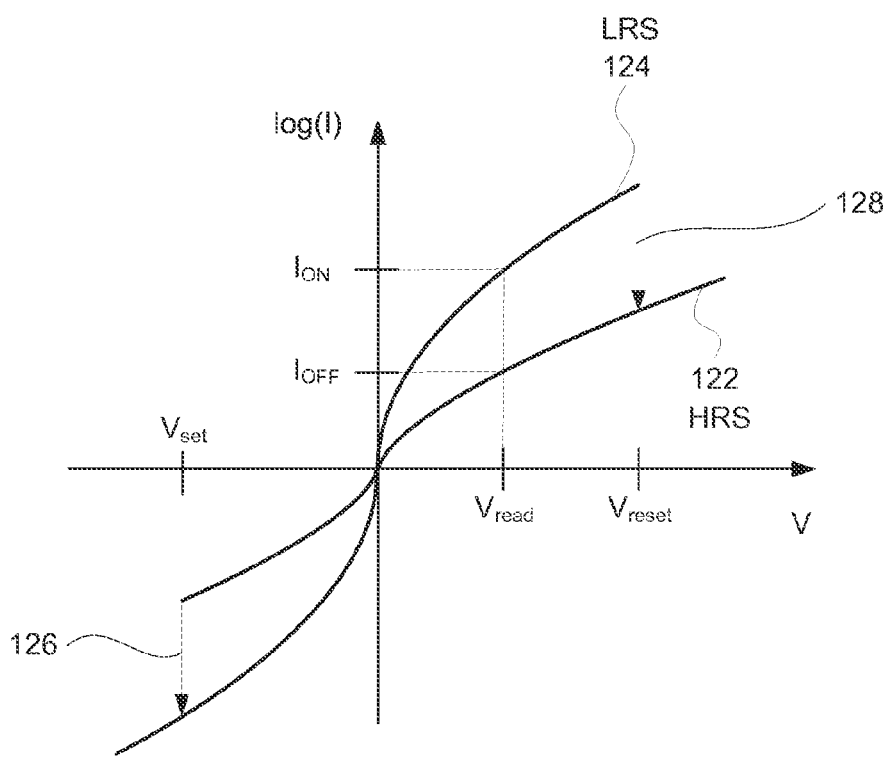
FIG. 2B illustrates a plot of a current passing through a bipolar ReRAM cell as a function of a voltage applied to the ReRAM cell, in accordance with some embodiments.

Specifically, FIG. 2A illustrates a plot of a log current passing through a unipolar ReRAM cell as a function of a voltage applied to the ReRAM cell, in accordance with some embodiments. FIG. 2B illustrates the same type of a plot for a bipolar ReRAM cell, in accordance with some embodiments. The HRS is defined by line 122, while the LRS is defined by 124 in both plots. Each of these states is used to represent a different logic state, e.g., the HRS may represent logic one ("1") and LRS representing logic zero ("0") or vice versa. Therefore, each ReRAM cell that has two resistance states may be used to store one bit of data. It should be noted that some ReRAM cells may have three and even more resistance states allowing multi-bit storage in the same cell.

The overall operation of the ReRAM cell may be divided into a read operation, set operation (i.e., turning the cell "ON" by changing from its HRS to LRS), and reset operation (i.e., turning the cell "OFF" by changing from its LRS to HRS). During the read operation, the state of the ReRAM cell or, more specifically, the resistive state of its resistance of resistive switching layer can be sensed by applying a sensing voltage to its electrodes. The sensing voltage is sometimes referred to as a "READ" voltage or simply a reading voltage and indicated as $V_{READ}$ in FIG. 2. If the ReRAM cell is in its HRS (represented by line 122 in FIGS. 2A and 2B), the external read and write circuitry connected to the electrodes will sense the resulting "OFF" current ($I_{OFF}$) that flows through the ReRAM cell. As stated above, this read operation may be performed multiple times without changing the resistive state (i.e., switching the cell between its HRS and LRS). In the above example, the ReRAM cell should continue to output the "OFF" current ($I_{OFF}$) when the read voltage ($V_{READ}$) is applied to the electrodes for the second time, third time, and so on.

Continuing with the above example, when it is desired to turn "ON" the cell that is currently in the HRS switch, a set operation is performed. This operation may use the same read and write circuitry to apply a set voltage ($V_{SET}$) to the electrodes. Applying the set voltage forms one or more conductive paths in the resistive switching layer as described above with reference to FIGS. 1B and 1C. The switching from the HRS to LRS is indicated by dashed line 126 in FIGS. 2A and 2B. The resistance characteristics of the ReRAM cell in its LRS are represented by line 124. When the read voltage ($V_{READ}$) is applied to the electrodes of the cell in this state, the external read and write circuitry will sense the resulting "ON" current ($I_{ON}$) that flows through the ReRAM cell. Again, this read operation may be performed multiple times without switching the state of the ReRAM cell.

At some point, it may be desirable to turn "OFF" the ReRAM cell by changing its state from the LRS to HRS. This operation is referred to as a reset operation and should be distinguished from set operation during which the ReRAM cell is switched from its HRS to LRS. During the reset operation, a reset voltage ($V_{RESET}$) is applied to the ReRAM cell to break the previously formed conductive paths in the resistive switching layer. Switching from a LRS to HRS is indicated by dashed line 128. Detecting the state of the ReRAM cell while it is in its HRS is described above.

Overall, the ReRAM cell may be switched back and forth between its LRS and HRS many times. Read operations may be performed in each of these states (between the switching operations) one or more times or not performed at all. It should be noted that application of set and reset voltages to change resistance states of the ReRAM cell involves complex mechanisms that are believed to involve localized resistive heating as well as mobility of defects impacted by both temperature and applied potential.

In some embodiments, the set voltage ($V_{SET}$) is between about 100 mV and 10V or, more specifically, between about 500 mV and 5V. The length of set voltage pulses ($t_{SET}$) may be less than about 100 milliseconds or, more specifically, less than about 5 milliseconds and even less than about 100 nanoseconds. The read voltage ($V_{READ}$) may be between about 0.1 and 0.5 of the write voltage ($V_{SET}$). In some embodiments, the read currents ($I_{ON}$ and $I_{OFF}$) are greater than about 1mA or, more specifically, is greater than about 5 mA to allow for a fast detection of the state by reasonably small sense amplifiers. The length of read voltage pulse ($t_{READ}$) may be comparable to the length of the corresponding set voltage pulse ($t_{SET}$) or may be shorter than the write voltage pulse ($t_{RESET}$). ReRAM cells should be able to cycle between LRS and HRS between at least about $10^3$ times or, more specifically, at least about $10^7$ times without failure. A data retention time ($t_{RET}$) should be at least about 5 years or, more specifically, at least about 10 years at a thermal stress up to 85° C. and small electrical stress, such as a constant application of the read voltage ($V_{READ}$). Other considerations may include low current leakage, such as less than about 40 A/cm² measured at 0.5 V per 20 Å of oxide thickness in HRS.

Examples of ReRAM Cells

Figure 3A:
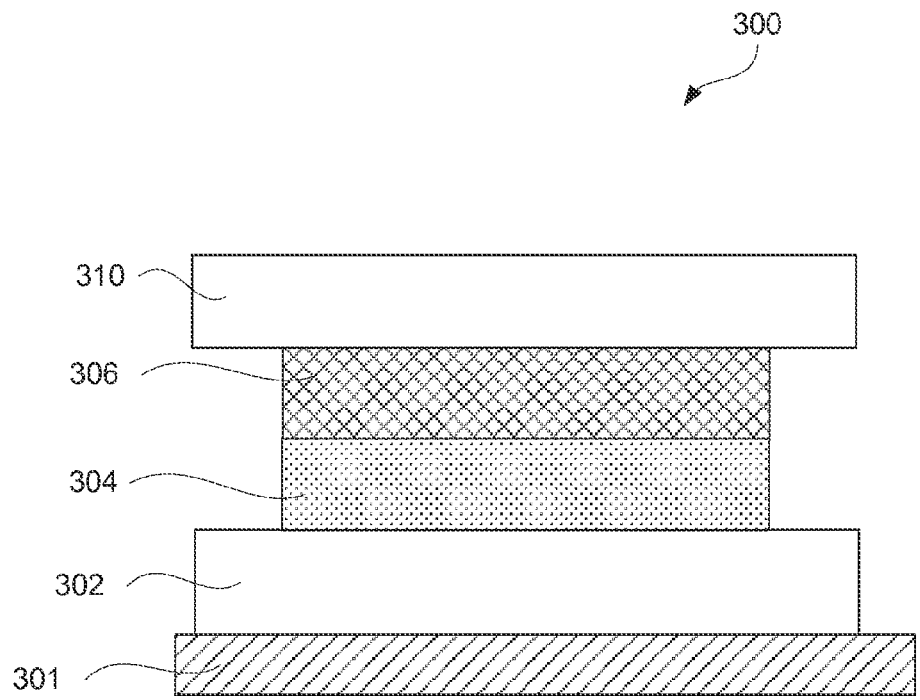
FIG. 3A illustrates a schematic representation of a ReRAM cell including a selector and other components, in accordance with some embodiments.

FIG. 3A illustrates a schematic representation of a ReRAM cell 300, in accordance with some embodiments. ReRAM cell 300 may include first electrode 302, resistive switching layer 304, selector 306, and second electrode 310. The "first" and "second" terminology is used herein only for differentiating reasons and does not imply any deposition order or spatial orientation of the layers unless specifically noted. In some embodiments, ReRAM cell 300 has more or fewer layers. In the same or different example, an intermediate layer may be disposed between resistive switching layer 304 and selector 306 in order, for example, to prevent fluoride ion depletion from selector 306. First electrode 302 and/or second electrode 310 may be connected to signal lines interconnecting ReRAM cell 300 with control circuitry and, in some embodiments, with other cells, if, for example, ReRAM cell 300 is a part of a memory array. Alternatively, first electrode 302 and/or second electrode 310 may be operable as signal lines and, in some embodiments, shared by other ReRAM cells.

In some embodiments, ReRAM cell 300 includes first electrode 302 disposed over substrate 301. Substrate 301 may include other components, such as additional ReRAM cells forming an array with ReRAM cell 300. ReRAM cell 300 also includes resistive switching layer 304 disposed over first electrode 302 such that first electrode 302 is disposed between resistive switching layer 304 and substrate 301. ReRAM cell 300 also includes selector 306 disposed over resistive switching layer 304 such that resistive switching layer 304 is disposed between first electrode 302 and selector 306. ReRAM cell 300 also includes second electrode 310 disposed over selector 306 such that selector 306 is disposed between resistive switching layer 304 and second electrode 310. It should be noted that selector 306 and resistive switching layer 304 form a stack between first electrode 302 and second electrode 310 such that selector 306 and resistive switching layer 304 are connected in series within ReRAM cell 300.

Selector 306 is configured to undergo electrical breakdown when a voltage across selector 306 achieves a certain threshold, which may be referred to as a breakdown voltage. Examples of performance characteristics of selector 306 are presented in FIGS. 3C and 3D. Specifically, FIG. 3C illustrates an I-V plot 330 having two distinctive zones, pre-breakdown zone 332 and pre-breakdown zone 334. The resistance of selector in these two zones 332 and 334 is significantly different. FIG. 3D illustrates an I-V plot for a selector that may be used in a bipolar ReRAM cell. The breakdown voltage may be the same regardless of the polarity. As noted above, the breakdown may have a more complex hysteretic behavior because the current-voltage curve may be multivalued, such as the one shown in FIG. 3E. In this case, different upward branches are followed during voltage changes. Upon reaching the threshold voltage, the current increases in a step-like manner to a new value, which may set by the current compliance/series resistance. The current will not decrease substantially until the current (and thus the voltage) is lowered below the holding voltage.

For purposes of this description, electrical breakdown refers to a rapid reduction in the resistance of selector 306 when the voltage applied across selector 306 exceeds the breakdown voltage. This results in a portion of selector 306 becoming electrically conductive. The condition created by the electrical breakdown may be maintained until the voltage applied across selector 306 is maintained above the breakdown voltage.

Selector 306 includes amorphous silicon doped with fluorine. In some embodiments, the concentration of fluorine in selector 306 is between about 0.01% atomic and 3% atomic or, more specifically, between about 0.5% atomic and 2% atomic. Selector 306 may consist essentially of amorphous silicon and fluorine. In other words, selector 306 may have substantially no components other than amorphous silicon and fluorine. Specifically, the combined concentration of amorphous silicon and fluorine in selector 306 may be at least about 99.5% atomic and even at least about 99.9% atomic. In some embodiments, selector 306 is configured to remain at least partially amorphous when subjected to anneal at a temperature of about 750 degrees Celsius or higher, such as up to about 1000 degrees Celsius. The thickness of the selector is chosen depending on the desired breakdown voltage, e.g. the thickness may be between 5 and 200 nm, such as between 10 and 50 nm. In general, a selector that is less than 5 nm thick is too leaky, while a selector thicker than 200 nm is too bulky for modern devices.

Figure 3B:
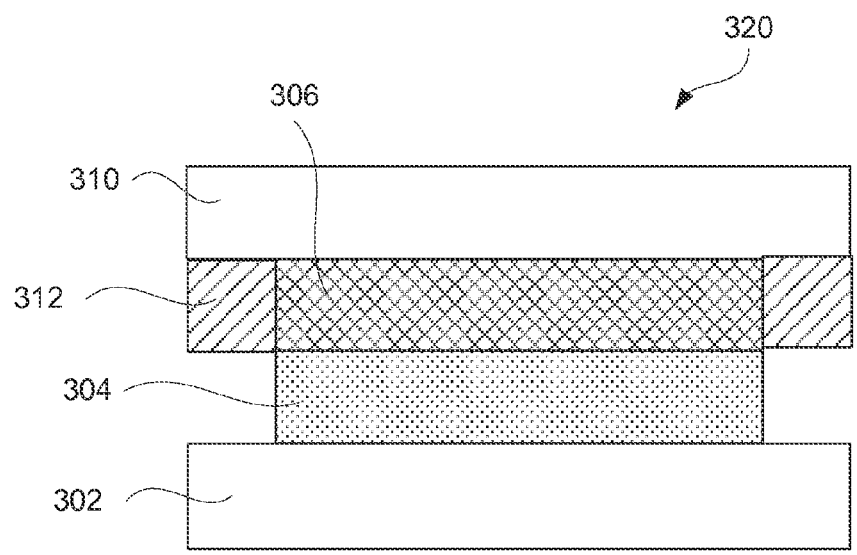
FIG. 3B illustrates a schematic representation of a ReRAM cell including a selector, fluorine reservoir, and other components, in accordance with some embodiments.
Figure 3C:
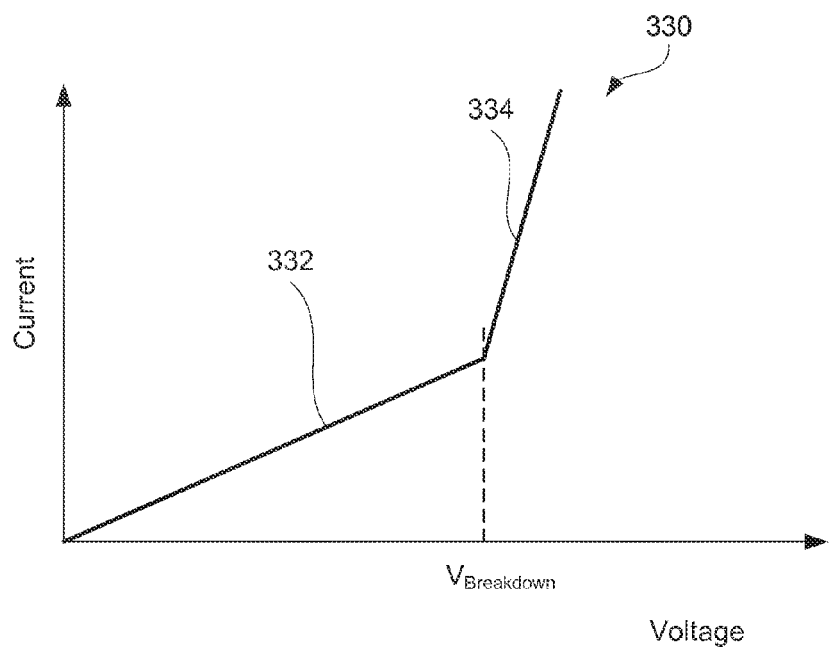
FIGS. 3C-3E are schematic plots illustrating performance of selectors in ReRAM cells, in accordance with some embodiments.
Figure 3D:
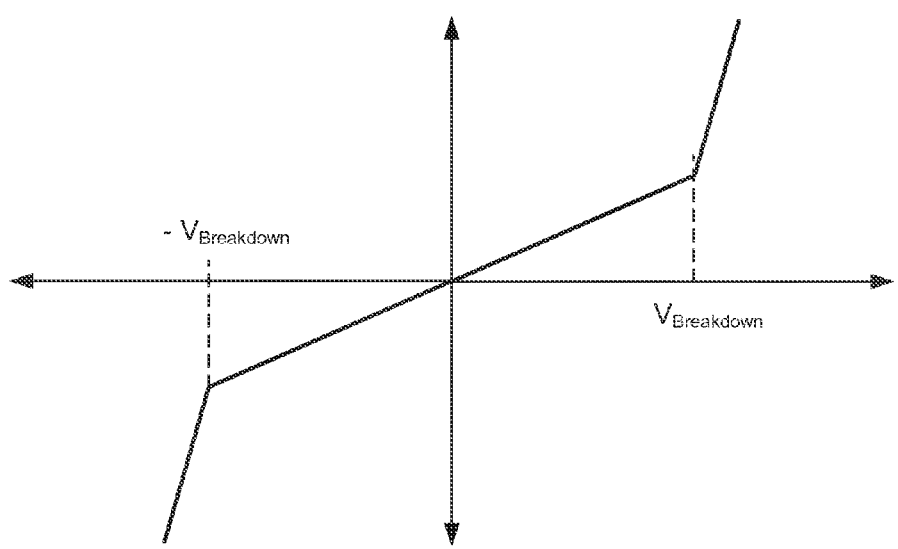
Figure 3E:
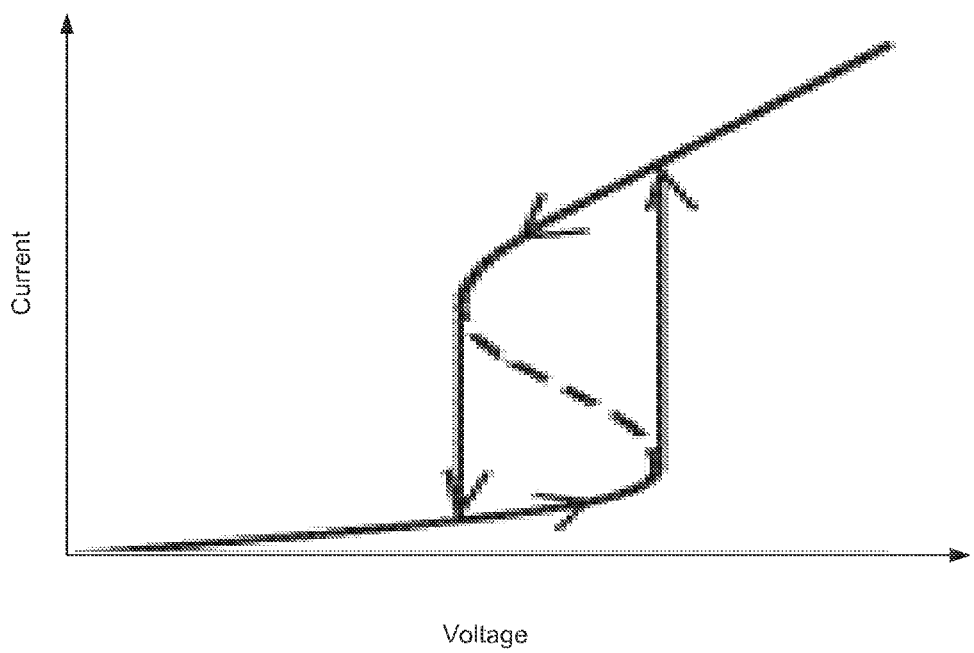

In some embodiments, selector 306 directly interfaces second electrode 310 as, for example, shown in FIG. 3B. At least a portion of second electrode 310 interfacing selector 306 may be doped with fluorine. The concentration of fluorine in that portion of second electrode 310 may be greater than the concentration of fluorine in selector 306. For example, the concentration of fluorine in the portion of second electrode 310 directly interfacing selector 306 may be between about 2% atomic and 4% atomic, such as about 3% atomic. As such, second electrode 310 may be operable as a fluorine reservoir or, more specifically, as a fluoride ion reservoir, for selector 306. Overtime, fluoride ions may be depleted from selector 306 due to fluoride ion diffusion out of selector 306 resulting from concentration gradients (e.g., no fluoride ions in other components interfacing selector 306), electrical potentials applied to selector 306, and other factors.

In some embodiments, ReRAM cell 320 includes fluoride ion source 312 directly interfacing selector 306 as, for example, shown in FIG. 3B. Fluoride ion source 312 may be a different component from electrodes 302 and 310, resistive switching layer 304, and such. Fluoride ion source 312 may be positioned such that current densities through fluoride ion source 312 are much lower than through selector 306 (as for example shown in FIG. 3B), which allows to have a slower rate of fluoride ion depletion from fluoride ion source 312 than from selector 306 and to use fluoride ion source 312 with higher concentrations of fluoride ions than selector 306. In some embodiments, the concentration of fluorine in fluoride ion source 312 may be higher than the concentration of fluorine in selector 306. As shown in FIG. 3B, selector 306 may also directly interface second electrode 310, which may be responsible for depleting fluorine from selector 306.

Resistive switching layer 304 can be fabricated from a dielectric material, such as a metal oxide material or other similar material that can be switched between two or more stable resistive states. Some examples of suitable materials include hafnium oxide, zirconium oxide, tantalum oxide, titanium oxide, aluminum oxide, and silicon oxide. In some embodiments, resistive switching layer 304 is fabricated from a silicon oxide. Resistive switching layer 304 may include a first sub-layer including silicon oxide and a second sub-layer including hafnium oxide. Selector 306 directly may directly interface resistive switching layer 304.

Resistive switching layer 304 may have a thickness of between about 1 nm to about 100 nm, such as between about 2 nm and 20 nm or, more specifically, between about 5 nm and 10 nm. For example, resistive switching layer 304 may have a thickness of about 10 nm. Thinner resistive switching layers may be deposited using ALD, while thicker resistive switching layers may be deposited using may be deposited using ALD or physical vapor deposition (PVD) or, in some embodiments, chemical vapor deposition (CVD).

Electrode 310 may be fabricated from a conductive material that has a desirable conductivity (for a given application), work function, and either chemical stability or sufficiently low reactivity in contact with amorphous silicon. Such materials may include p-type polysilicon, n-type polysilicon, pure or doped graphitic or amorphous carbon, transition metals that do not form silicides, transition metal alloys, transition metal nitrides, or transition metal carbides. For example, electrode 310 may include one or more of aluminum (Al), copper (Cu), silver (Ag), or gold (Au). Electrode 310 may include titanium/aluminum alloy and/or a silicon-doped aluminum, and/or titanium nitride (TiN). In some embodiments, electrode 310 may be formed from aluminum. Electrode 310 may be between about 3 nm and about 500 nm thick or, more specifically, between about 5 nm and about 100 nm thick.

Electrode 302 may be fabricated from a conductive material that has a desirable conductivity and work function, such as p-type polysilicon, n-type polysilicon, transition metals, transition metal alloys, transition metal nitrides, or transition metal carbides. For example, electrode 310 may include one or more of titanium (Ti), tungsten (W), tantalum (Ta), cobalt (Co), molybdenum (Mo), nickel (Ni), vanadium (V), hafnium (Hf) aluminum (Al), copper (Cu), platinum (Pt), palladium (Pd), iridium (Ir), or ruthenium (Ru). Electrode 310 may include titanium/aluminum alloy and/or a silicon-doped aluminum. In some embodiments, electrode 310 may be formed from titanium, tantalum, or aluminum. Electrode 310 may be between about 5 nm and about 500 nm thick or, more specifically, between about 10 nm and about 100 nm thick.

Processing Examples

Figure 4:
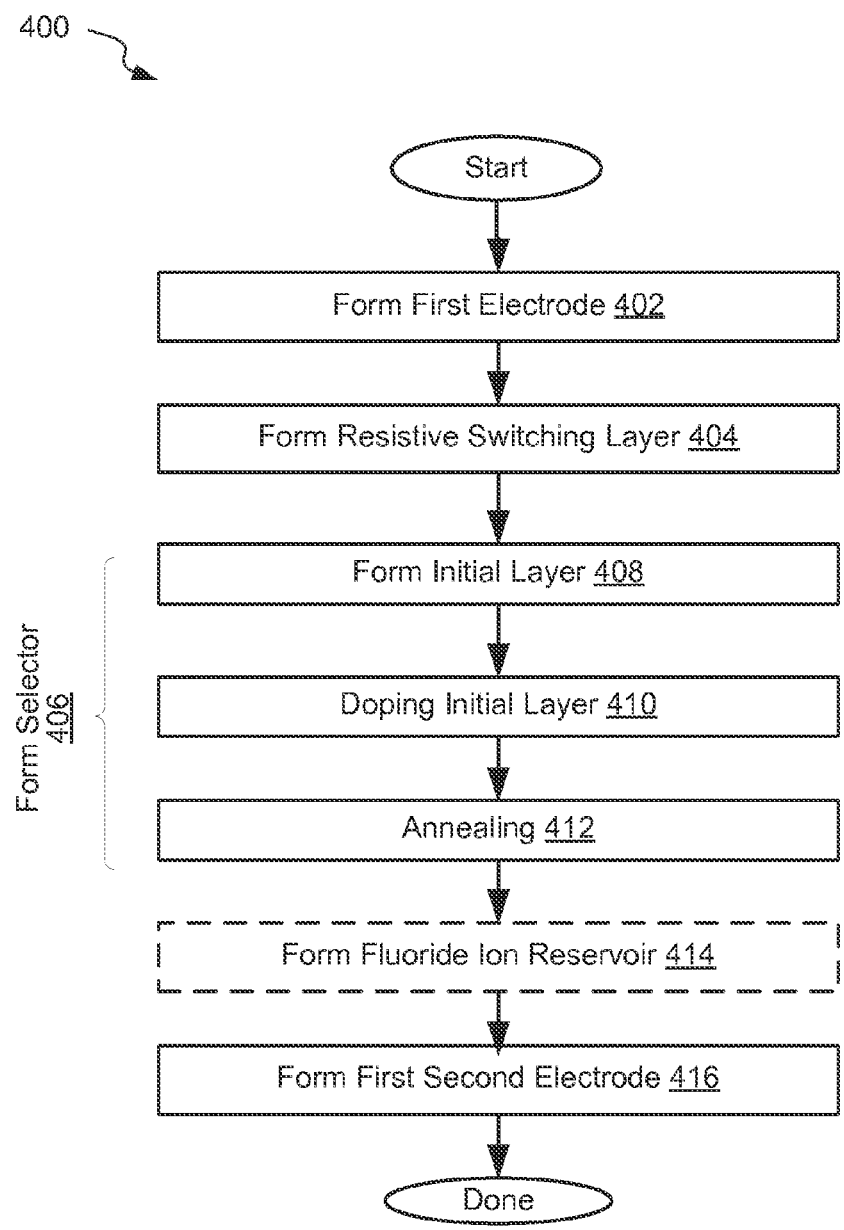
FIG. 4 illustrates a process flowchart corresponding to a method of fabricating a ReRAM cell including a selector, in accordance with some embodiments.

FIG. 4 illustrates a process flowchart corresponding to method 400 of fabricating a ReRAM cell, in accordance with some embodiments. Method 400 may commence with forming a first electrode over a substrate during operation 402. The substrate may include one or more components, such as a first signal line. In some embodiments, a titanium nitride electrode may be formed using PVD or other suitable deposition techniques. Deposition of the titanium nitride layer may be performed using a titanium target in a nitrogen atmosphere maintained. These process parameters are provided as examples and generally depend on deposited materials, tools, deposition rates, and other factors. Other processing techniques, such as ALD, PLD, CVD, evaporation, and the like can also be used to deposit the first electrode.

Method 400 may proceed with forming a resistive switching layer during operation 404. The resistive switching layer may be formed directly over the first electrode. The resistive switching layer may include a material, such as silicon oxide, hafnium oxide, zirconium oxide, or other suitable materials. The thickness of the resistive switching layer may be at between about 5 Angstroms and 100 Angstroms or, more specifically, between about 10 Angstroms and 50 Angstroms. Any suitable deposition technique may be used to form the resistive switching layer, such as an atomic layer deposition (ALD) process or a physical vapor deposition (PVD) process. For example, an oxide may be deposited using a PVD target sputtered in an oxygen containing environment. In another example, a PVD process may be used to deposit a layer of material and a plasma containing environment may be used to oxide the deposited layer.

Method 400 may then proceed with forming a selector during operation 406. In some embodiments, operation 406 includes a number of sub-operations, such as forming an amorphous silicon layer during sub-operation 408, implanting fluorine into the amorphous silicon layer during sub-operation 410, and annealing during sub-operation 412. Sub-operation 408 may involve chemical vapor deposition. Sub-operation 410 may involve ion implantation. In some embodiments, method 400 involves annealing the resistive switching memory cell at a temperature of about 750 degrees Celsius, e.g., during sub-operation 412. The third layer remains amorphous after this annealing operation.

Method 400 may proceed with forming a fluoride ion reservoir during operation 414. For examples, a portion of the selector over the resistive switching layer may be masked while a portion of the selector extending beyond the footprint of the resistive switching layer may be subjected to further ion implantation yielding a structure similar to the one shown in FIG. 3B. Alternatively, a selector and fluoride ion reservoir may be formed at the same time by first depositing an amorphous silicon layer and then subjecting this layer to ion implantation. For example, a sub-layer oversaturated with fluorine may be formed during this ion implantation. The thickness of this oversaturated sub-layer may be between about 0.7 nanometers and 3 nanometers. In some embodiments, an additional amorphous silicon layer is formed over the oversaturated sub-layer. This additional amorphous silicon layer may be referred to as a cap layer Annealing may be then used to at least partially redistribute fluorine layers in the formed structures there by forming the selector, e.g., from the capping layer.

Method 400 may also involve forming a second electrode during operation 416. Operation 416 may be similar to operation 402, which is described above.

Memory Array Examples

A brief description of memory arrays will now be described with reference to FIGS. 5A and 5B to provide better understanding to various aspects of thermally isolating structures provided adjacent to ReRAM cells and, in some examples, surrounding the ReRAM cells. ReRAM cells described above may be used in memory devices or larger integrated circuits (IC) that may take a form of arrays. FIG. 5A illustrates a memory array 500 including nine ReRAM cells 502, in accordance with some embodiments. In general, any number of ReRAM cells may be arranged into one array. Connections to each ReRAM cell 502 are provided by signal lines 504 and 506, which may be arranged orthogonally to each other. ReRAM cells 502 are positioned at crossings of signal lines 504 and 506 that typically define boundaries of each ReRAM cell in array 500.

Signal lines 504 and 506 are sometimes referred to as word lines and bit lines. These lines are used to read and write data into each ReRAM cell 502 of array 500 by individually connecting ReRAM cells to read and write controllers. Individual ReRAM cells 502 or groups of ReRAM cells 502 can be addressed by using appropriate sets of signal lines 504 and 506. Each ReRAM cell 502 typically includes multiple layers, such as first and second electrodes, resistive switching layer, embedded current steering elements, and the like, some of which are further described elsewhere in this document. In some embodiments, a ReRAM cell includes multiple resistive switching layers provided in between a crossing pair of signal lines 504 and 506.

As stated above, various read and write controllers may be used to control operations of ReRAM cells 502. A suitable controller is connected to ReRAM cells 502 by signal lines 504 and 506 and may be a part of the same memory device and circuitry. In some embodiments, a read and write controller is a separate memory device capable of controlling multiple memory devices each one containing an array of ReRAM cells. Any suitable read and write controller and array layout scheme may be used to construct a memory device from multiple ReRAM cells. In some embodiments, other electrical components may be associated with the overall array 500 or each ReRAM cell 502. For example, to avoid the parasitic-path-problem, i.e., signal bypasses by ReRAM cells in their low resistance state (LRS), serial elements with a particular non-linearity must be added at each node or, more specifically, into each element. Depending on the switching scheme of the ReRAM cell, these elements can be diodes or varistor-type elements with a specific degree of non-linearity. In the same other embodiments, an array is organized as an active matrix, in which a transistor is positioned at each node or, more specifically, embedded into each cell to decouple the cell if it is not addressed. This approach significantly reduces crosstalk in the matrix of the memory device.

Figure 5B:
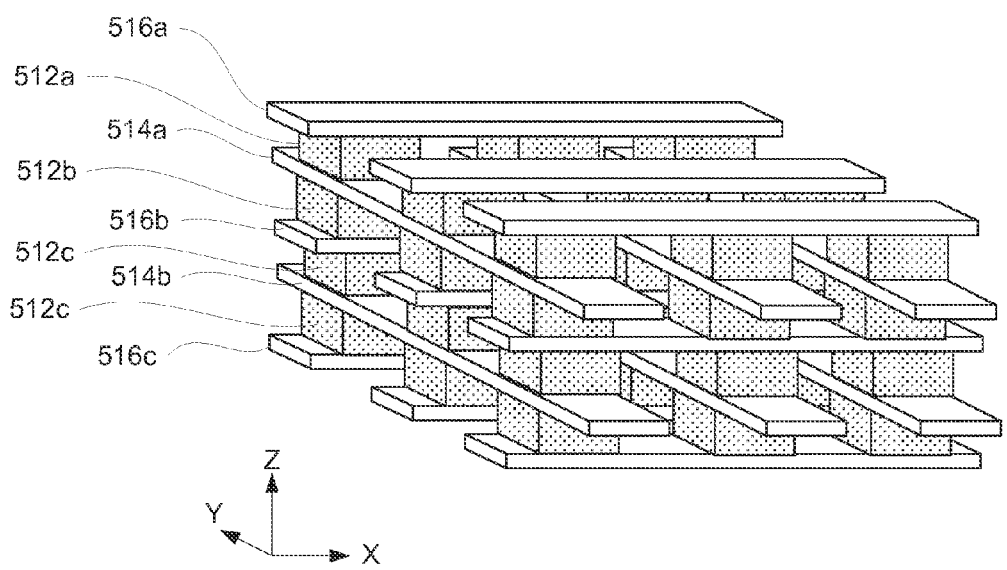

In some embodiments, a memory device may include multiple array layers as, for example, illustrated in FIG. 5B. In this example, five sets of signal lines 514a-b and 516a-c are shared by four ReRAM arrays 512a-c. As with the previous example, each ReRAM array is supported by two sets of signal lines, e.g., array 512a is supported by 514a and 516a. However, middle signal lines 514a-b and 516b, each is shared by two sets ReRAM arrays. For example, signal line set 514a provides connections to arrays 512a and 512b. First and second sets of signal lines 516a and 516c are only used for making electrical connections to one array. This 3-D arrangement of the memory device should be distinguished from various 3-D arrangements in each individual ReRAM cell.

CONCLUSION

Although the foregoing examples have been described in some detail for purposes of clarity of understanding, the invention is not limited to the details provided. There are many alternative ways of implementing the invention. The disclosed examples are illustrative and not restrictive.

What is claimed:

1. A resistive switching memory cell comprising:
a first layer disposed over a substrate;
a second layer disposed over the first layer such that the first layer is disposed between the second layer and the substrate;
a third layer disposed over the second layer such that the second layer is disposed between the first layer and the third layer; and
a fourth layer disposed over the third layer such that the third layer is disposed between the second layer and the fourth layer,
wherein the first layer and the fourth layer are operable as electrodes,
wherein the second layer is operable to switch between a low resistive state and a high resistive state in response to a switching pulse applied between the first layer and the fourth layer, and
wherein the third layer is operable as a selector and comprises amorphous silicon doped with fluorine.

2. The resistive switching memory cell of claim 1, wherein a concentration of fluorine in the third layer is between about 0.01% atomic and 3% atomic.

3. The resistive switching memory cell of claim 1, wherein a concentration of fluorine in the third layer is between about 0.5% atomic and 2% atomic.

4. The resistive switching memory cell of claim 1, wherein the third layer consists essentially of amorphous silicon and fluorine.

5. The resistive switching memory cell of claim 1, wherein the third layer directly interfaces the fourth layer and at least a portion of the fourth layer interfacing the third layer is doped with fluorine.

6. The resistive switching memory cell of claim 5, wherein a concentration of fluorine in the portion of the fourth layer interfacing the third layer is higher than a concentration of fluorine in the third layer.

7. The resistive switching memory cell of claim 1, further comprising a fluoride ion source directly interfacing the third layer, wherein a concentration of fluorine in the fluoride ion source is higher than a concentration of fluorine in the third layer, and wherein the third layer directly interfaces the fourth layer.

8. The resistive switching memory cell of claim 1, wherein the second layer comprises one of hafnium oxide, zirconium oxide, tantalum oxide, titanium oxide, aluminum oxide, or silicon oxide.

9. The resistive switching memory cell of claim 8, wherein the third layer directly interfaces the second layer.

10. The resistive switching memory cell of claim 1, wherein the third layer is configured to remain at least partially amorphous when subjected to anneal at a temperature of about 750 degrees Celsius.

* * * * *